United States Patent [19]

André

[11] 4,133,705
[45] Jan. 9, 1979

[54] METHOD FOR THE EPITAXIAL DEPOSITION OF A SEMICONDUCTOR MATERIAL BY ELECTRICAL POLARIZATION OF A LIQUID PHASE AT CONSTANT TEMPERATURE

[75] Inventor: Elie André, Herouville, France

[73] Assignee: U.S. Philips Corporation, New York, N.Y.

[21] Appl. No.: 812,262

[22] Filed: Jul. 1, 1977

[30] Foreign Application Priority Data

Jul. 9, 1976 [FR] France .................................. 76 21107

[51] Int. Cl.² .................. H01L 21/208; H01L 21/368
[52] U.S. Cl. .................................... 148/171; 148/1.5; 148/172; 148/173; 156/602; 156/605; 204/39; 204/61
[58] Field of Search .......................... 148/115, 171–173; 156/602, 605; 204/39, 61

[56] References Cited

U.S. PATENT DOCUMENTS

| | | | |
|---|---|---|---|
| 2,842,467 | 7/1958 | Landauer et al. | 156/602 |
| 2,999,776 | 9/1961 | Dorendorf et al. | 156/602 |
| 3,086,857 | 4/1963 | Pfann | 156/602 |
| 3,268,301 | 8/1966 | Rummel et al. | 156/602 |
| 3,378,409 | 4/1968 | Hurle et al. | 156/602 |
| 3,411,946 | 11/1968 | Tramposch | 148/172 X |
| 3,752,713 | 8/1973 | Sakuta et al. | 148/172 X |
| 3,879,235 | 4/1975 | Gatos et al. | 148/172 X |
| 3,948,692 | 4/1976 | Golubev et al. | 156/602 X |
| 3,993,511 | 11/1976 | Daniele | 148/172 |
| 4,012,242 | 3/1977 | Matare | 156/602 X |

OTHER PUBLICATIONS

Lichtensteiger et al., "Modulation of Dopant . . . Crystal Growth," J. Electrochem. Soc., vol. 118, No. 6, 1971 (Jun.), pp. 1013–1014.

Kumagawa et al., "Current-Controlled Growth . . . Liquid Phase Epitaxy," IBID, vol. 120, No. 4, Apr. 1973, pp. 583–584.

Primary Examiner—L. Dewayne Rutledge
Assistant Examiner—W.G. Saba
Attorney, Agent, or Firm—Thomas A. Briody

[57] ABSTRACT

A method for the epitaxial deposition of a semiconductor by electrical polarization of a liquid phase at constant temperature.

Outside the growth time the polarization is applied in the direction of the cooling by the Peltier effect with a current density which is lower than the threshold which causes the growth and which lies near same.

8 Claims, 2 Drawing Figures

METHOD FOR THE EPITAXIAL DEPOSITION OF A SEMICONDUCTOR MATERIAL BY ELECTRICAL POLARIZATION OF A LIQUID PHASE AT CONSTANT TEMPERATURE

The present invention relates to a method for the expitaxial deposition, from a liquid phase, of a layer of semiconductor compound material on a substrate while using electrical polarization between solid and liquid in a space which is maintained at a constant and uniform temperature.

Semiconductor compound material may be deposited expitaxially at a constant temperature from a liquid phase so as to form a slight temperature gradient at the interface between solid and liquid by means of the Peltier-effect, which gradient produces the crystallisation. In fact, in the case of contact between the liquid phase and the solid phase of the same semiconductor compound or of a semiconductor compound and a solution of said compound in one of its constituents, an electrical polarization causes a local cooling or heating in accordance with the direction of polarization. With a suitable and sufficient polarization, a local gradient may thus be formed at the interface so as to cause a crystalline layer to grow on a substrate, even in a space of constant and uniform temperature.

The methods for the crystalline growth which use the Peltier effect enable the manufacture of expitaxial layers of homogeneous composition and with an accurate doping in considerable thicknesses, but the quality of the interfaces between substrate and the deposited layer or between two superimposed layers remains difficult to ensure. The beginning of the nucleation of the layer which is deposited on a substrate or on a preceding underlying layer, can be disturbed due to the application of voltage to the system solid-liquid so that there passes through it a current which is sufficient to obtain the growth by the Peltier effect but which brings the liquid in the polarization state which differs from the natural polarization state without the passage of current.

On the other hand, when a junction is realized between two epitaxial layers by modifying the composition of a solution between two deposition treatments, the interruption of the polarization, even at constant temperature and in nearly isothermal conditions, results in the local dissolution of the solid even if such dissolution is not desired. Furthermore, interruption of the polarization may also produce a segregation of impurities in the sense of a reduction of the gradient at the interface, while an abrupt junction is sometimes necessary; this case presents itself, for example, in certain hetero structures for electroluminescent devices.

It is a special object of the present invention to mitigate these drawbacks and to improve the possibilities of the known methods of liquid phase epitaxy, in particular methods using the Peltier effect. The invention has for its special object to enable improvement of the qualities of the interface between an epitaxial deposit and its support.

The invention is based on the recognition gained by Applicants that in certain temperature and composition conditions of the liquid phase there exists a threshold for the polarization voltage or the current density which results from a polarization voltage in the direction which produces a Peltier effect to eliminate thermal energy at the interface between solid and liquid, which threshold must be exceeded so as to produce an epitaxial growth efficaciously and at constant and substantially uniform temperature. Below said threshold, no growth takes place in spite of the electrical field at the interface, above the threshold a significant growth takes place. Applicants have established in addition that the rate of deposition is no linear function of the current density as a result of the polarization; as a matter of fact, the deposition rate as a function of the applied polarization or of the current density which results herefrom follows a curve which is analogous to that of the current through a semiconductor diode as a function of the applied polarization.

It is a furthermore known that for very strong polarizations the Joule effect becomes very large and compensates the cooling which is caused due to the Peltier effect and that no expitaxial growth takes place any longer.

According to the invention, the method involves the epitaxial deposition from a liquid phase, of a layer of semiconductor compound material on a substrate while using an electrical polarization between solid and liquid in a space which is kept at a constant and uniform temperature outside the growth time of the epitaxial deposit, the polarization is applied in the direction which produces a cooling by the Peltier effect with a current density which is lower than the threshold which causes the growth.

When a polarisation which is lower than the threshold but is very near to it, is applied prior to the growth, conditions are created in the liquid and at the interface which resemble those which enable the growth, the polarization state of the liquid medium is substantially the same and the potential distribution in the electrolyte which forms the liquid mass is that of the growth. So the passage to expitaxial growth conditions does not produce interferences at the interface between solid and liquid nor in the vicinity of said interface, the time during which the polarisation lower than the threshold is maintained having permitted the establishment of a new equilibrium which is very close to the condition of the system during the growth.

When a first expitaxial layer has been deposited and a second layer of a material of, for example, different conductivity type and different composition is to be deposited on the first layer, the method according to the invention permits obtaining a satisfactory interface. This effect is particularly favourable in the case in which both layers are deposited from liquids comprising the same components in different but approximate proportions.

According to a preferred embodiment, after applying a polarization which is slightly lower than the threshold, the growth of the deposited layer is then achieved by current passage in the direction which causes a cooling by the Peltier element with at least initially a current density which is higher than the threshold but is near to it. Thus a minimum of interference is caused between the equilibrium state which is obtained by the polarization below the threshold and the growth conditions.

It has been found that with conditions which are near the growth threshold, the rate of deposition is important, the variation of such rate of deposition as a function of the current density being very rapid as soon as the threshold has been passed.

It is favorable to proceed gradually from the polarization lower than the threshold to the polarisation higher than the threshold by applying a regularly increasing voltage. The downward adjustment of the polarization to a level below such threshold preferably is also carried out gradually by applying a regularly decreasing voltage.

The step of the polarization without growth provided in the method according to the invention, may be used to obtain a modulation of doping impurities at the interface between two layers or at the surface of a layer. The layers deposited by epitaxy are in fact often doped, especially by the addition of doping elements in the liquid solution from which the deposit is carried out. The electrical field applied between substrate and liquid causes a segregation and redistribution of the impurities, either in the direction of an accumulation in the solid, or in the direction of an exhaust from the solid.

Dependent on the doping elements chosen and the constituents of the liquid mass, it is possible to obtain an abrupt junction when this is necessary by using the saturation effect of the interface of impurities, which is permitted by polarization below the growth threshold.

When an epitaxial layer is deposited and the liquid remains in contact with the deposited layer, for example, to add to the liquid either a component or a doping impurity of which the concentration in the next layer is to be increased, a superficial dissolution of the solid may occur even in conditions of uniform and constant temperature which it is desired to ensure for the growth by Peltier effect. In order to avoid such dissolution between the two deposits, a polarisation is applied to the system/liquid-solid in the direction of the cooling by the Peltier effect with a current density which is lower than the growth threshold. In the case in which the growth of the first layer has been obtained by polarization, such polarization, instead of interrupting it, is maintained still in the direction of cooling by Peltier effect but at a current density level which is slightly below the growth threshold. Such polarization serves to ensure a gradient which is sufficient to avoid a dissolution of a substrate without causing growth. When the solution has been modified in the desired conditions, the growth of the new epitaxial layer may be undertaken by current passage with a current density which exceeds the threshold.

It is to be noted that the value of the current density threshold is a function of various factors and especially of the temperature, the current density threshold which ensures the growth by Peltier effect being higher when the temperature is lower, the other conditions being identical. The current density threshold which ensures the growth by Peltier effect is also higher when the composition of the material used corresponds to a higher chemical potential (or a larger forbidden bandwidth).

The invention may be applied in particular for the epitaxial deposition of the various layers of semiconductor devices, especially hetero structures having III–V compounds, for example gallium arsenide or gallium aluminium aresenide; the invention may be used favourably to realise electroluminescent devices in which the method according to the invention improves the efficacy.

The invention will now be described in greater detail with reference to the accompanying drawings.

Figure 1:
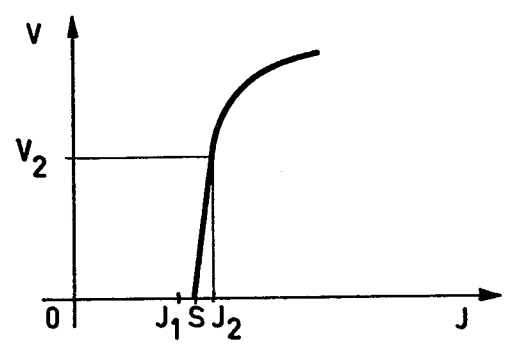
FIG. 1 shows a curve which denotes the speed of a deposit as a function of the current density in the case of epitaxy by Peltier effect.

FIG. 1 shows a curve which denotes the rate of growth, v, of the thickness of the epitaxial deposit as a function of the current density, J, which traverses the interface between the substrate and a solution in the direction of the cooling by Peltier effect. It is found that the curve indicates a rate O for all the values of current density lower than a threshold S, that from such threshold value, S, the rate of deposition rapidly increases, the increases less and less, the consequences of a Joule effect becoming more and more apparent. According to the invention, for the actual epitaxial deposition in the same direction as that which will afterwards cause the growth, there is applied a voltage such that the current density is maintained at a value J, which is lower than S but which is near to it. The growth of the deposition is then preferably initiated by applying such a voltage that the current density is maintained at a value $J_2$ which is higher than S but is near to S, the rate of deposition then being $V_2$.

Figure 2:
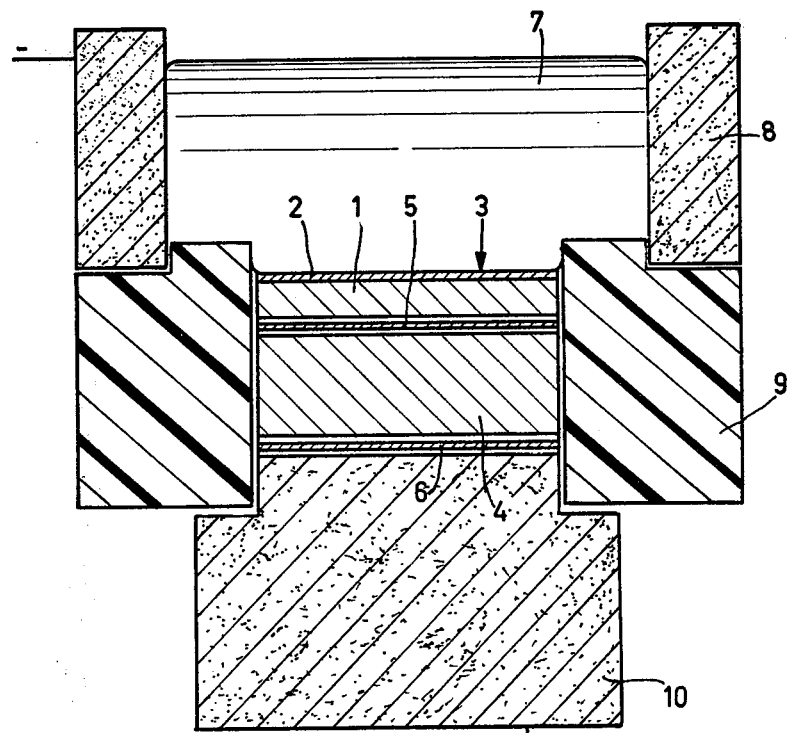
FIG. 2 is a diagrammatic sectional view of the apparatus used for carrying out the method according to the invention.

For example, a substrate 1 is used which is shown in FIG. 2 and which is n-type gallium arsenide. The substrate 1 is placed on an assembly comprising a thin tantalum plate 5, a thick polycrystalline gallium arsenide plate 4 and a thin tantalum plate 6. The whole bears on a graphite body 10 which constitutes the bottom of a crucible, the wall of which consists of an insulating ring 9, for example, of boronitride and a graphite ring 8. Liquid gallium improves the contact between the plates 4, 5, 6, the substrate 1 and the body 10.

The body 4 of gallium arsenide serves to improve the thermal growth conditions. If the substrate 1, which is very thin, is placed directly on the graphite body 10, the temperature $T_0$ at the interface solid-liquid will remain equal to $T_1$ of the body 10, the thermal energy which is absorbed by the Peltier effect being supplied from said body at the temperature of the furnace and there is no growth. Between the interface solid-liquid and the body 10 there should be a sufficient thickness of material which is a less good heat conductor than graphite in order that $T_0 < T_1$. If the substrate 1 were sufficiently thick, the plate 4 would not be necessary.

A solution 7 of gallium aluminum arsenide in gallium is contacted with the readily prepared surface of the substrate 1, the assembly being heated and maintained at a uniform temperature on the order of 800 to 850° C. The solution contains, for example, 0.15% aluminum and its volume is on the order of 3 $cm^3$. Because the substrate surface area is on the order of 2 $cm^2$ and the resistance of the assembly of the plates and of the substrate is on the order of 0.15 Ohm, a current of 4 Ampères is passed for which no growth occurs. After a few minutes the voltage between the body 10 and the ring 8 is increased so gradually that a current of 5 Ampères is obtained for which a deposit 2 of gallium aluminium arsenide is obtained, the growth occurring at a rate which is higher than 1 micron per hour.

After depositing the necessary thickness, the voltage is reduced so gradually that the current is reduced to 4 Ampères.

What is claimed is:

1. A method for the epitaxial deposition from a liquid phase, of a layer of semiconductor compound material on a substrate, comprising the steps of providing said substrate and said liquid phase in a space and applying electrical polarization between said solid and liquid in said space which is maintained at a constant and uniform temperature, said polarization being applied so that outside the growth time of said epitaxial deposit, the polarization is in the direction which causes a cooling by the Peltier effect and with a current density which is lower than the threshold level which causes the growth of said epitaxial deposit.

2. A method for the epitaxial deposition as in claim 1, wherein said polarization that is lower than said threshold level, is applied prior to the growth of said epitaxial layer on said substrate.

3. A method for the epitaxial deposition as in claim 2, wherein, after applying said polarization which is lower than said threshold level, the growth of said layer of semiconductor material is obtained by current passage in the direction which produces a cooling by Peltier effect and with a current density which lies near, but above, said threshold level.

4. A method for the epitaxial deposition as in claim 2, wherein the voltage adjustment of said polarization applied between said solid and liquid on either side of said threshold level is carried out gradually.

5. A method for the epitaxial deposition as in claim 1, wherein said polarization lower than said threshold level is applied after the growth of a first said epitaxial layer and said solid and liquid used for said growth remain in contact with each other at a constant and uniform temperature.

6. A method for the epitaxial deposition as in claim 5, wherein doping elements are incorporated in said first layer and the polarization lower than the threshold is used to modify the doping of said first layer in the surface part.

7. The method for the epitaxial deposition as in claim 1, wherein the material of said substrate and that of said liquid phase from which a layer is deposited, comprise at least two components of which at least one element is of column III of the periodic table of elements and at least another element is of column V.

8. A method for the epitaxial deposition as in claim 7, wherein said substrate consists essentially of gallium arsenide and a layer of essentially gallium aluminum arsenide is deposited from a solution in liquid gallium, such deposit being achieved by current passage in the direction which produces a cooling by Peltier effect and with a current density which lies near, but above, said threshold level.

* * * * *